(12) United States Patent  (10) Patent No.: US 8,519,622 B2
Iwase et al.  (45) Date of Patent: Aug. 27, 2013

(54) DISPLAY APPARATUS

(75) Inventors: Yuichi Iwase, Kanagawa (JP); Yasunori Kijima, Tokyo (JP); Jiro Yamada, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/456,320

(22) Filed: Apr. 26, 2012

(65) Prior Publication Data

US 2012/0205681 A1  Aug. 16, 2012

Related U.S. Application Data

(63) Continuation of application No. 12/873,983, filed on Sep. 1, 2010, now Pat. No. 8,179,038, which is a continuation of application No. 11/899,489, filed on Sep. 6, 2007, now Pat. No. 7,828,617, which is a continuation of application No. 11/441,874, filed on May 26, 2006, now Pat. No. 7,282,856, which is a continuation of application No. 10/240,358, filed as application No. PCT/JP02/04611 on May 13, 2002, now Pat. No. 7,071,619.

(30) Foreign Application Priority Data

Nov. 1, 2001  (JP) ................................ 2001-336772
Mar. 5, 2002  (JP) ................................ 2002-059040

(51) Int. Cl.
 *H05B 33/00*  (2006.01)
(52) U.S. Cl.
 USPC .......................................... 313/512; 313/506
(58) Field of Classification Search
 USPC ................................. 313/506–512
 See application file for complete search history.

(56) References Cited

U.S. PATENT DOCUMENTS

| 4,767,679 | A | 8/1988 | Kawachi |
| 5,780,174 | A | 7/1998 | Tokito et al. |
| 5,909,081 | A | 6/1999 | Eida et al. |
| 6,103,541 | A | 8/2000 | Yang et al. |
| 6,445,005 | B1 | 9/2002 | Yamazaki et al. |
| 6,548,960 | B2 | 4/2003 | Inukai |
| 6,706,425 | B2 | 3/2004 | Ishii et al. |
| 6,717,052 | B2 | 4/2004 | Wang et al. |
| 6,894,431 | B2 | 5/2005 | Yamazaki et al. |
| 2001/0015618 | A1 | 8/2001 | Yamazaki et al. |
| 2002/0047555 | A1 | 4/2002 | Inukai |

FOREIGN PATENT DOCUMENTS

| EP | 0 809 420 | 11/1997 |
| EP | 1 122 794 | 8/2001 |
| JP | 04-212287 | 8/1992 |
| JP | 05-182759 | 7/1993 |
| JP | 07-161474 | 6/1995 |
| JP | 07-7142173 | 6/1995 |
| JP | 07-320865 | 12/1995 |
| JP | 08-222369 | 8/1996 |
| JP | 09-092466 | 4/1997 |

(Continued)

*Primary Examiner* — Joseph L Williams
(74) *Attorney, Agent, or Firm* — K&L Gates LLP

(57) ABSTRACT

Provided is a display apparatus and a method of manufacture. The display apparatus includes a first substrate with a plurality of organic electroluminescence devices, a second substrate with a color filter, the second substrate facing the first substrate, and an adhesive layer disposed between the first substrate and the second substrate so as to cover the plurality of organic electroluminescence devices, the adhesive layer being made of a material selected from the group consisting of a phenol resin, a melanin resin, an unsaturated polyester resin, an epoxy resin, a silicon resin and a polyurethane resin.

12 Claims, 8 Drawing Sheets

(56) References Cited

FOREIGN PATENT DOCUMENTS

| | | |
|---|---|---|
| JP | 11-040344 | 2/1999 |
| JP | 11-040345 | 2/1999 |
| JP | 11-345688 | 4/1999 |
| JP | 11-185955 | 7/1999 |
| JP | 11-260562 | 9/1999 |
| JP | 11-297476 | 10/1999 |
| JP | 11-327448 | 11/1999 |
| JP | 2000-068049 | 3/2000 |
| JP | 2000-068069 | 3/2000 |
| JP | 2000-133444 | 5/2000 |
| JP | 2001-267070 | 9/2000 |
| JP | 2001-068271 | 3/2001 |
| JP | 2001-100668 | 4/2001 |
| JP | 2001-217072 | 8/2001 |
| JP | 2001-230072 | 8/2001 |
| JP | 2001-236025 | 8/2001 |
| JP | 2001-336772 | 12/2001 |
| JP | 2002-008853 | 1/2002 |
| JP | 2002-008855 | 1/2002 |
| JP | 2002-059040 | 2/2002 |
| WO | 98/34437 | 8/1998 |
| WO | 01/39554 | 5/2001 |

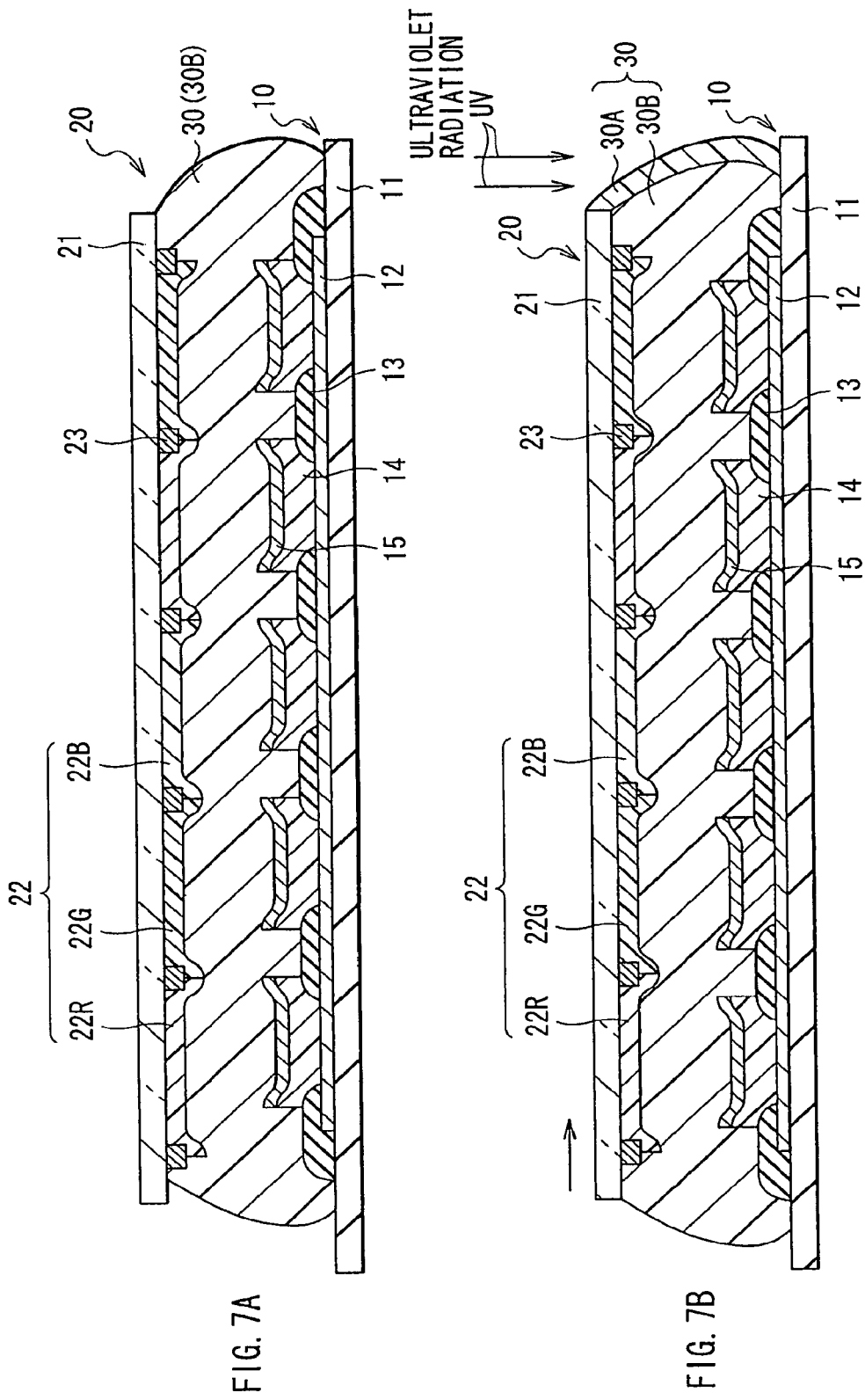

DISPLAY APPARATUS

CROSS REFERENCES TO RELATED APPLICATIONS

The present application is a continuation of U.S. application Ser. No. 12/873,983 filed on Sep. 1, 2010, which is a continuation of U.S. application Ser. No. 11/899,489 filed on Sep. 6, 2007, which is a continuation of U.S. application Ser. No. 11/441,874, filed on May 26, 2006, and issued as U.S. Pat. No. 7,282,856 on Oct. 16, 2007, which is a continuation of U.S. application Ser. No. 10/240,358, filed on May 12, 2003, and issued as U.S. Pat. No. 7,071,619 on Jul. 4, 2006, which is a National Stage of International Application No. PCT/JP02/04611 filed on May 13, 2002, of which claims priority to Japanese Patent Application No. 2001-336772 filed on Nov. 1, 2001 and to Japanese Patent Application No. 2002-059040 filed on Mar. 5, 2002, the entire contents of which are hereby incorporated by reference.

BACKGROUND

The present disclosure relates to a display apparatus comprising a drive panel including an organic electroluminescence device (organic EL device) disposed on a substrate for drive and a sealing panel, which are bonded together with an adhesive layer.

In recent years, organic EL displays using an organic electroluminescence device as an alternative to liquid crystal displays have become a focus of attention. The organic EL displays are of a self-luminous type, so it is considered that the organic EL displays have advantages of a wide viewing angle, low power consumption and adequate response to high-definition high-speed video signals. Therefore, the organic EL displays have been developed to achieve the practical use thereof.

A known organic electroluminescence device includes, for example, a first electrode, an organic layer having a light-emitting layer, and a second electrode which are laminated in this order on a substrate for drive. The organic electroluminescence device are sealed by the substrate for drive and a substrate for sealing facing the substrate for drive with an adhesive layer made of, for example, an ultraviolet cure resin in between (For example, Japanese Unexamined Patent Application Publication No. Hei 5-182759, Japanese Unexamined Patent Application Publication No. Hei 11-40345, Japanese Unexamined Patent Application Publication No. Hei 11-297476, Japanese Unexamined Patent Application Publication No. 2000-68049 and so on). Further, in order to prevent the occurrence of a non-light emitting area (dark spot), the organic electroluminescence device is typically covered with, for example, an inorganic protective film (For example, Japanese Unexamined Patent Application Publication No. Hei 11-40345, Japanese Unexamined Patent Application Publication No. Hei 11-297476, Japanese Unexamined Patent Application Publication No. 2000-68049, Japanese Patent No. 3170542 and so on). In such an organic electroluminescence device, light generated in the light-emitting layer may be extracted from the side of the substrate for drive or the side of the second electrode depending upon the type of display.

However, in the organic EL display using such an organic electroluminescence device, there is a problem that the reflection of external light in a wiring electrode disposed in the organic electroluminescence device and between the organic electroluminescence devices is large, thereby resulting in reduced contrast as a display. Therefore, it has been considered that a color filter or a reflected-light absorbing film is provided to prevent the reflection of external light. It has been reported that in the case of a display of the type which extracts light from the side of the substrate for drive, the color filter or the like is disposed on the substrate for drive, and a layer made of an ultraviolet cure resin is formed and cured on the color filter to form the organic electroluminescence device (Japanese Unexamined Patent Application Publication No. Hei 11-260562). Moreover, it has been reported that after the organic electroluminescence device is formed on the substrate for drive, while the organic electroluminescence device is sealed with the layer made of an ultraviolet cure resin and a substrate for sealing, a supplementary substrate including the color filter, etc. is disposed on the side of the substrate for drive, and a layer made of the ultraviolet cure resin is disposed only on an edge portion to bond the substrate for drive and the supplementary substrate together (Japanese Unexamined Patent Application Publication No. Hei 11-345688).

On the other hand, in the case of a display of the type which extracts light from the side of the second electrode, the color filter is disposed on the side of the substrate for sealing which seals the organic electroluminescence device. However, in the display of this type, the transmittance of ultraviolet radiation with a wavelength of 430 nm or less through the color filter and the reflected-light absorbing film to is low, so it is difficult to cover the organic electroluminescence device and bond the substrate for sealing with the ultraviolet cure resin, like the display of the conventional type which extracts light from the side of the substrate for drive.

In view of the foregoing, it is an object to provide a display apparatus of the type which extracts light from the side of the second electrode comprising a drive panel including an organic electroluminescence device and a sealing panel including a color filter which are easily bonded together.

SUMMARY

A display apparatus according to an embodiment comprises: a drive panel including a plurality of organic electroluminescence devices with a first electrode, one or more organic layers including a light-emitting layer, and a second electrode laminated in order on a substrate for drive, and extracting light generated in the light-emitting layer from the side of the second electrode; a sealing panel with a color filter disposed on a substrate for sealing, and facing the drive panel on the side of the second electrode; and an adhesive layer disposing between the sealing panel and the drive panel so as to cover the plurality of organic electroluminescence devices, and the adhesive layer being cured with at least heat.

In the display apparatus of the embodiment, the color filter is disposed on the substrate for sealing, so even if external light incident from the sealing panel is reflected on the organic electroluminescence devices, etc., the light is prevented from being emitted from the sealing panel and thereby the contrast can be improved. Moreover, the adhesive layer is disposed so as to cover the organic electroluminescence devices, so the organic electroluminescence devices are securely sealed. Further, the adhesive layer is cured with heat, so by the adhesive layer with excellent and stable adhesive properties, the drive panel and the sealing panel are easily bonded together, regardless of the presence or absence of the color filter.

Additional features and advantages are described herein, and will be apparent from the following Detailed Description and the figures.

BRIEF DESCRIPTION OF THE FIGURES

FIGS. 7A and 7B are cross sectional views showing steps following the step in FIG. 6C;

DETAILED DESCRIPTION

Preferred embodiments are described in more detail below referring to the accompanying drawings.

[First Embodiment]

Figure 1:
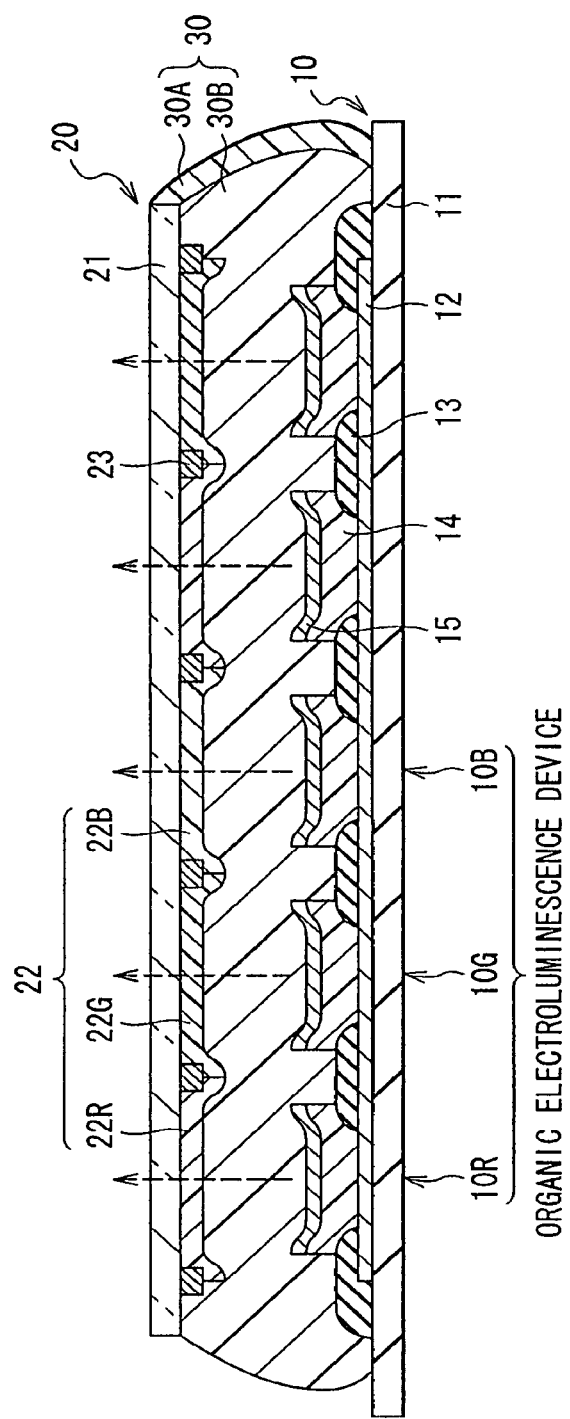
FIG. 1 is a cross sectional view of a display apparatus according to a first embodiment.

FIG. 1 shows a cross sectional view of a display apparatus according to a first embodiment. The display apparatus is used as an ultra-thin organic EL color display, etc., and in the display apparatus, for example, a drive panel 10 and a sealing panel 20 faces each other and the whole facing surfaces thereof are bonded together with an adhesive layer 30. The drive panel 10 includes an organic electroluminescence device 10R emitting red light, an organic electroluminescence device 10G emitting green light and an organic electroluminescence device 10B emitting blue light disposed in order in a matrix shape as a whole on a substrate for drive 11 made of, for example, an insulating material such as glass.

Each of the organic electroluminescence devices 10R, 10G and 10B includes, for example, an anode 12 as a first electrode, an insulating layer 13, an organic layer 14 and a cathode 15 as a second electrode laminated in this order from the side of the substrate for drive 11. The anode 12 and the cathode 15 are shared among the organic electroluminescence devices 10R, 10G and 10B in the direction orthogonal to each other, and have a function as wiring to supply a current to the organic electroluminescence devices 10R, 10G and 10B.

The anode 12 has a thickness in a laminating direction (hereinafter simply referred to as thickness) of approximately 200 nm, for example, and is made of a metal such as platinum (Pt), gold (Au), silver (Ag), chromium (Cr) or tungsten (W), or an alloy thereof.

The insulating layer 13 is provided to secure the insulation between the anode 12 and the cathode 15, and to accurately form light-emitting areas in the organic electroluminescence devices 10R, 10G and 10B into desired shapes. The insulating layer 13 has a thickness of approximately 600 nm, for example, and is made of an insulating material such as silicon dioxide (SiO2). The insulating layer 13 includes an aperture portion 13A corresponding to the light-emitting area.

Figure 2:
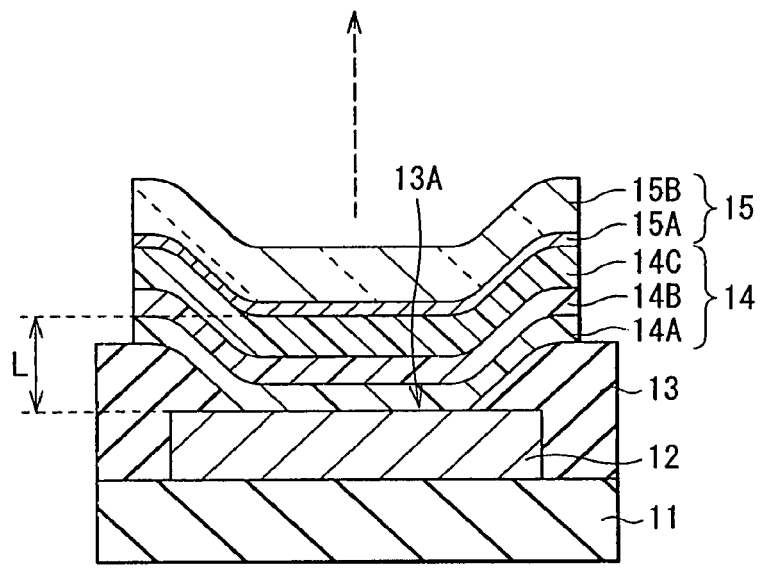
FIG. 2 is an enlarged cross sectional view of an organic electroluminescence device in the display apparatus shown in FIG. 1.

The organic layer 14 has a different structure for each of the organic electroluminescence devices 10R, 10G and 10B. FIG. 2 shows an enlarged view of the organic layer 14 in the organic electroluminescence devices 10R and 10G. In the organic electroluminescence devices 10R and 10G, the organic layer 14 includes a hole injection layer 14A, a hole transport layer 14B and a light-emitting layer 14C, each of which is made of an organic material, laminated in this order from the side of the anode 12. The hole injection layer 144 and the hole transport layer 14B are provided to improve the hole injection efficiency into the light-emitting layer 14C. The light-emitting layer 14C emits light by the injection of current, and emits light in an area corresponding to the aperture portion 13A of the insulating layer 13.

In the organic electroluminescence device 10R, the hole injection layer 14A has a thickness of, for example, approximately 30 nm, and is made of 4,4',4"-tris(3-methylphenylphenylamino)triphenylamine (MTDATA). The hole transport layer 14B has a thickness of, for example, approximately 30 nm, and is made of bis[(N-naphthyl)-N-phenyl]benzidine (a-NPD). The light-emitting layer 14C has a thickness of, for example, approximately 40 nm, and is made of a 8-quinolinol aluminum complex (Alq) blended with 2% by volume of 4-dicyanomethylene-6-(pdim e thylam ino styryl)-2-methyl-4H-p yran. (D CM).

In the organic electroluminescence device 10G, the hole injection layer 14A and the hole transport layer 14B are made of the same materials as those in the organic electroluminescence device 10R. The hole transport layer 14A has a thickness of, for example, approximately 30 nm, and the hole transport layer 14B has a thickness, for example, approximately 20 nm. The light-emitting layer 14C has a thickness of, for example, approximately 50 nm, and is made of a 8-quinolinol aluminum complex (Alq).

Figure 3:
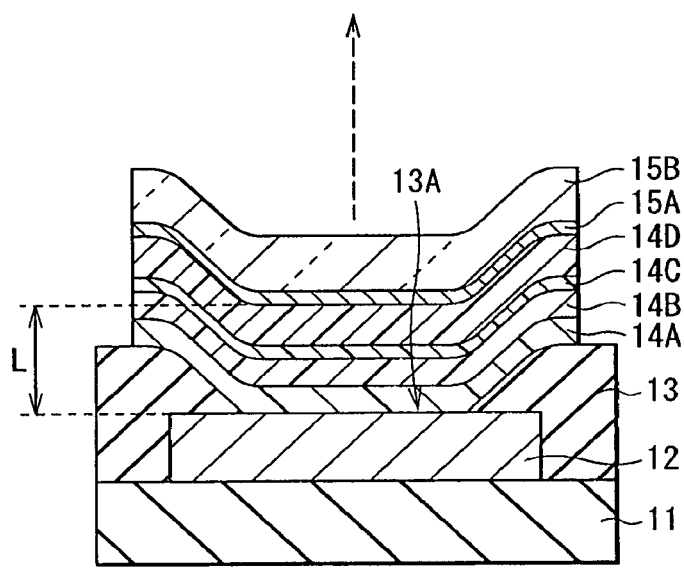
FIG. 3 is an enlarged cross sectional view of another organic electroluminescence device in the display apparatus shown in FIG. 1.

FIG. 3 shows an enlarged view of the organic layer 14 in the organic electroluminescence device 10B. In the organic electroluminescence device 10B, the organic layer 14 includes the hole injection layer 14A, the hole transport layer 14B, the light-emitting layer 14C and an electron transport layer 14D, each of which is made of an organic material, laminated in this order from the side of the anode 12. The electron transport layer 14D is provided to improve the electron injection efficiency into the light-emitting layer 14C.

In the organic electroluminescence device 10B, the hole injection layer 14A and the hole transport layer 14B are made of the same materials as those in the organic electroluminescence devices 10R and 10G. The hole transport layer 14A has a thickness of, for example, approximately 30 nm, and the hole transport layer 14B has a thickness of, for example, approximately 30 nm. The light-emitting layer 14C has a thickness of, for example, approximately 15 nm, and is made of bathocuproin (BCP). The electron transport layer 14D has a thickness of, for example, approximately 30 nm, and is made of Alq.

As shown in FIGS. 2 and 3, the cathode 15 includes a semitransparent electrode 15A having semi-transparency for light generated in the light-emitting layer 14C, and a transparent electrode having transmittance for the light generated in the light-emitting layer 14C, which are laminated in this order from the side of the organic layer 14. Thereby, the drive panel 10 extracts the light generated in the light-emitting layer 14C from the side of the cathode 15 as shown by arrows with dashed lines in FIGS. 1 through 3.

The semi-transparent electrode 15A has a thickness of, for example, approximately 10 nm, and is made of an alloy of magnesium (Mg) and silver (MgAg alloy). The semi-transparent electrode 15A is provided to reflect the light generated in the light-emitting layer 14C between the anode 12 and the semi-transparent electrode 15A. In other words, the semi-transparent electrode 15A and the anode 12 constitute a resonant portion in a resonator which resonates the light generated in the light-emitting layer 14C. It is preferable that such a resonator is constituted, because the light generated in the light-emitting layer 14C causes multiple interference to function as a kind of narrow-band filter, and thereby the half-value width of the spectrum of extracted light is reduced and color purity is improved. Further, it is preferable because external light incident from the sealing panel 20 can be attenuated by the multiple interference, and the reflectance of the external light on the organic electroluminescence devices 10R, 10G and 10B can become extremely small by a combination of a color filter 22 (refer to FIG. 1) to be described later.

For that purpose, it is preferable to match the peak wavelength of the narrow-band filter and the peak wavelength of the spectrum of light desired to be extracted. In other words, assuming that the phase shift of reflected light generated in the anode 12 and the semi-transparent electrode 15A is (13 (rad), the optical distance between the anode 12 and the semi-transparent electrode 15A is L, and the peak wavelength of the spectrum of light desired to be extracted from the side of the cathode 15 is X, the optical distance L preferably satisfies a mathematical formula 1, and in face, —the optical distance L is preferably selected to be a positive minimum value satisfying the mathematical formula 1. Further, in the mathematical formula 1, the units of L and X may be the same, for example, "nm".

$$2L/X4-43/27t=q \text{ ($q$ is an integer)} \qquad \text{(Mathematical Formula 1)}$$

The transparent electrode 15B is provided to reduce the electrical resistance of the semi-transparent electrode 15A, and is made of an electrically conductive material having sufficient translucency to the light generated in the light-emitting layer 14C. As the material of the transparent electrode 15B, for example, a compound including indium, zinc (Zn) and oxygen is preferable, because the compound can obtain good electrical conductivity even if film formation is carried out at ambient temperature. It is preferable that the thickness of the transparent electrode 15B is, for example, approximately 200 nm.

As shown in FIG. 1, the sealing panel 20 is disposed on the side of the cathode 15 of the drive panel 10, and includes a substrate for sealing 21 to seal the organic electroluminescence devices 10R, 10G and 10B together with an adhesive layer 30. The substrate for sealing 21 is made of a material transparent to light generated in the organic electroluminescence device 10R, 10G and 10B, such as glass. In the substrate for sealing 21, for example, the color filter 22 and a reflected-light absorbing film 23 as a black matrix are disposed to extract the light generated in the organic electroluminescence devices 10R, 10G and 10B, and to absorb external light reflected on the electroluminescence devices 10R, 10G and 10B as well as the anode 12 and the cathode 15 which are positioned in between as wiring, so that the contrast is improved.

The color filter 22 and the reflected-light absorbing film 23 may be disposed on either side of the substrate for sealing 21, but preferably they are disposed on the side facing the drive panel 10, because the color filter 22 and the reflected-light absorbing film 23 are not exposed to the surface and can be protected by the adhesive layer 30. The color filter 22 includes a red filter 22R, a green filter 22G and blue filter 22B which are disposed corresponding to the organic electroluminescence devices 10R, 10G and 10B, respectively.

Figure 4:
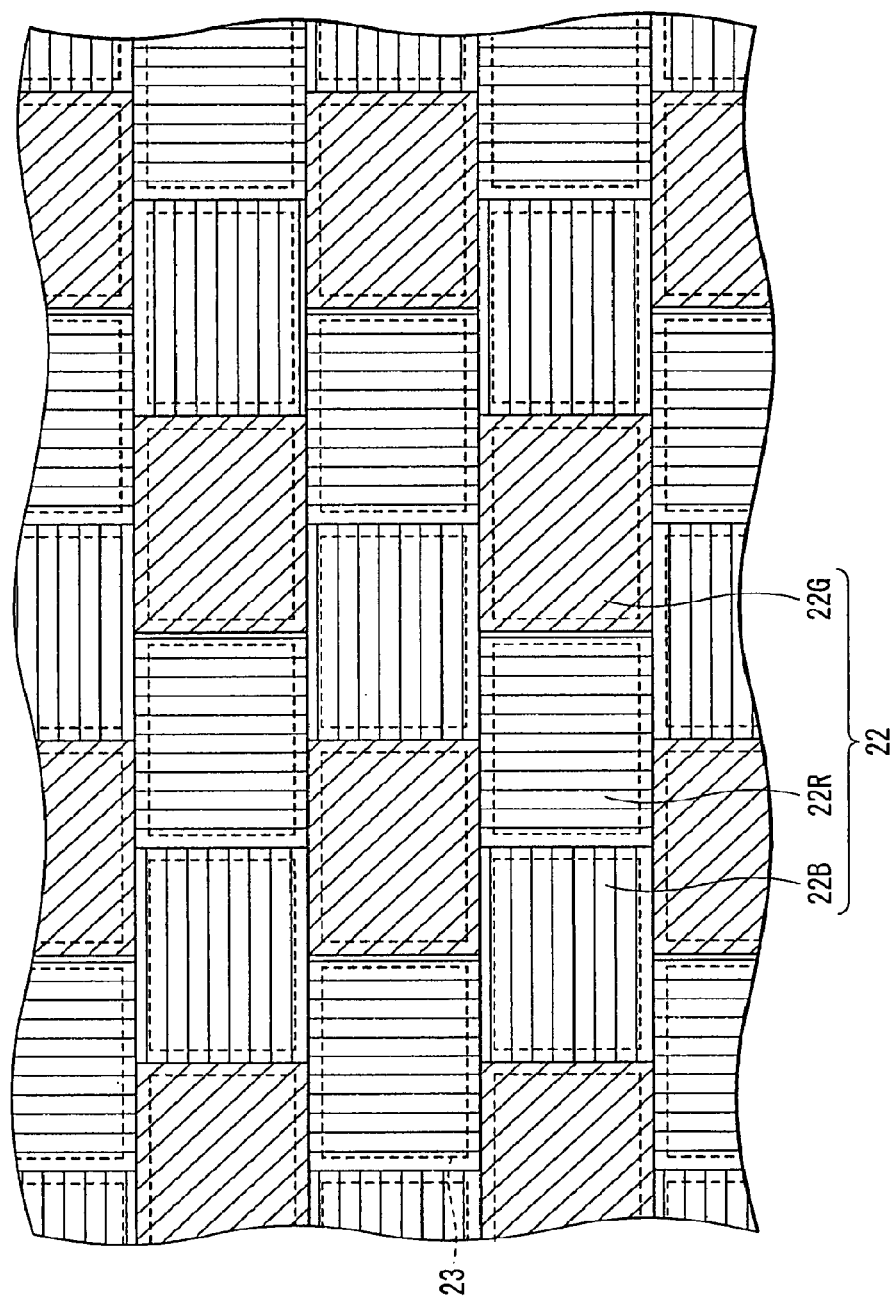
FIG. 4 is a plan view of a color filter in the display apparatus shown in FIG. 1 viewed from the side of a drive panel.

FIG. 4 shows a plan view of the color filter 22 viewed from the side of the drive panel 10. Further, in FIG. 4, in order to easily identify the red filter 22R, the green filter 22G and the blue filter 22B, the red filter 22R, the green filter 22G and the blue filter 22B are indicated with vertical lines, oblique lines and horizontal lines, respectively.

The red filter 22R, the green filter 22G and the blue filter 22B each have, for example, a rectangular shape, and are formed with no space in between. The red filter 22R, the green filter 22G and the blue filter 22B each are made of a resin mixed with pigments, and by the selection of the pigments, the light transmittance in a targeted wavelength of red, green or blue is adjusted to be higher, and the light transmittance in the other wavelengths is adjusted to be lower.

As shown in FIGS. 1 and 4, the reflected-light absorbing film 23 is disposed along the boundaries among the red filter 22R, the green filter 22G and the blue filter 22B. The reflected-light absorbing film 23 is made of a black resin film containing, for example, a black colorant with an optical density of 1 or more, or a thin film filter using the interference of a thin film. More preferably, the reflected-light absorbing film 23 is made of the black resin film, because the reflected-light absorbing film 23 can be easily formed at low cost. The thin film filter is made of a laminate including one or more layers of thin films of, for example, metal, a metal nitride or a metal oxide so as to attenuate light by the use of the interference of the thin films. A laminate of chromium and chromium oxide (III) ($Cr_2O_3$) in alternate order is taken as a specific example of the thin film filter.

As shown in FIG. 1, the adhesive layer 30 covers the whole surface of the drive panel 10 on the side where the organic electroluminescence devices 10R, 10G and 10B are disposed so as to more effectively prevent corrosion and damage of the organic electroluminescence devices 10R, 10G and 10B. The adhesive layer 30 is cured with at least heat. In other words, at least a part of the adhesive layer 30, more specifically at least a portion of the adhesive layer 30 covering the organic electroluminescence devices 10R, 10G and 10B is a portion 30B cured with heat. The portion 30B cured with heat is made of, for example, a thermosetting resin such as a phenol resin, a melanin resins an unsaturated polyester resin, an epoxy resin, a silicon resin, a polyurethane resin or the like.

A temporary fixing portion 30A is formed in a part of an edge portion of the adhesive layer 30. The temporary fixing portion 30A is made of, for example, an ultraviolet cure resin, and is formed so as to straddle between the sealing panel 20 and the drive panel 10. The temporary fixing portion 30A is provided to align the relative position of the sealing panel 20 with the drive panel 10.

The display apparatus can be manufactured through, for example, the following steps.

Figure 5A:
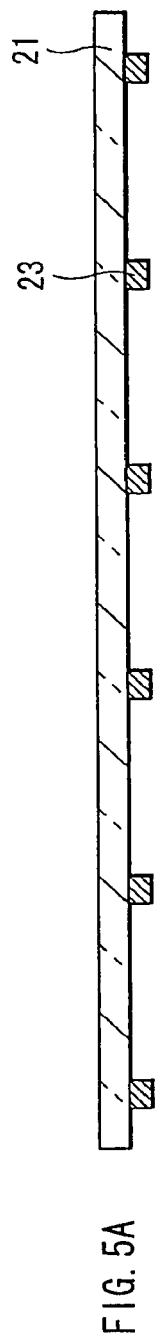
FIGS. 5A through 5C are cross sectional views sequentially showing steps of manufacturing the display apparatus shown in FIG. 1.
Figure 5B:
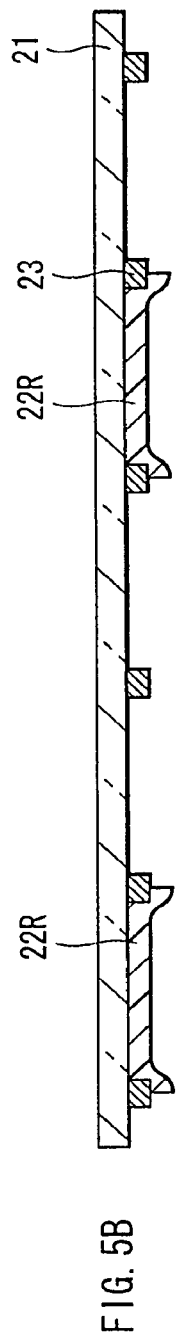
Figure 5C:
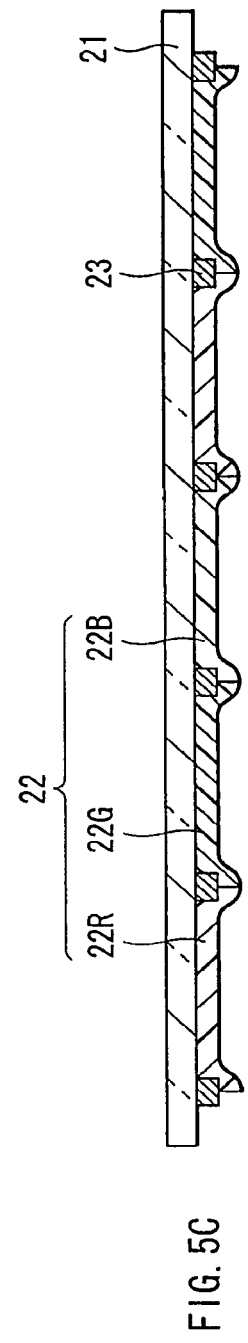

FIGS. 5A through 7B show a method of manufacturing the display apparatus step by step. First, as shown in FIG. 5A, the reflected-light absorbing film 23 made of the above-described material is formed on the substrate for sealing 21 made of the above-described material, and then is patterned into the shape shown in FIG. 4. Next, as shown in FIG. 5B, the material of the red filter 22R is coated on the substrate for sealing 21 through a spin coat method or the like, and then the material of the red filter 22R is patterned and fired through photolithography to form the red filter 22R. It is preferable that an edge portion of the red filter 22R covers the reflected-light absorbing film 23 during patterning, because it is difficult to pattern the red filter 22R with high accuracy so as not to cover the reflected-light absorbing film 23, and a portion overlaid on the reflected-light absorbing film 23 does not affect the display of an image. Then, as shown in FIG. 5C, like the red filter 22R, the blue filter 22B and the green filter 22G are formed in order. Thereby, the sealing panel 20 is formed.

Figure 6A:
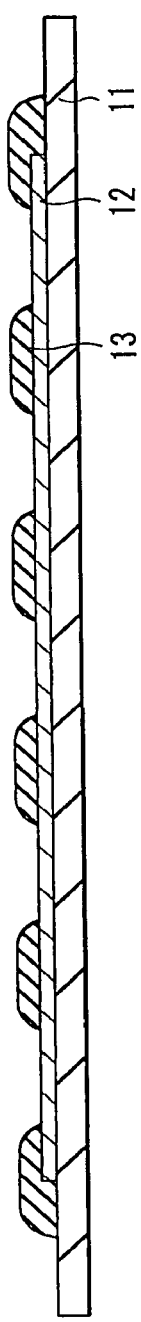
FIGS. 6A through 6C are cross sectional views showing steps following the step in FIG. 5C.

Further, as shown in FIG. 6A, for example, a plurality of anodes 12 made of the above-described material are formed in- parallel on the substrate for drive 11 made of the above-described material through, for example, direct current sputtering. Then, the insulating layer 13 of the above-described thickness is formed on the anodes 12 through, for example, CVD (chemical vapor deposition), and a portion of the insulating layer 13 corresponding to a light-emitting area is selectively removed through lithography to form the aperture portion 13A.

Figure 6B:
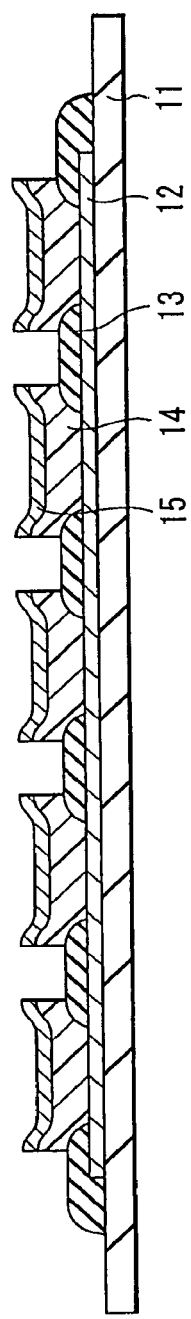

Next, as shown in FIG. 6B, corresponding to the aperture portion 13A of the insulating layer 13, the hole injection layer 14A, the hole transport layer 14B, the light-emitting layer 14C and the electron transport layer 14D, each of which is made of the above-described material and has the above-described thickness, are formed in order by the use of an area mask (not shown) through, for example, vapor deposition. At this time, the area mask is changed depending upon the organic electroluminescence devices 10R, 10G and 10B to form the layers. Further, it is difficult to carry out vapor deposition only on the aperture portion 13A with high accuracy, so it is preferable that each layer is formed so as to cover the whole aperture portion 13A and slightly cover the edge of the insulating layer 13. After forming the organic layer 14, a plurality of semi-transparent electrodes 15A which have the above-described thickness and are made of the above-described material are formed in parallel in the direction perpendicular to the anodes 12 by the use of the area mask (not shown) through, for example, vapor deposition. After that, on the semitransparent electrodes 15A, the transparent electrodes 15B are formed through, for example, direct current sputtering by the use of the same area mask used when the semi-transparent electrodes 15A are formed. Thereby, the drive panel 10 is formed.

Figure 6C:
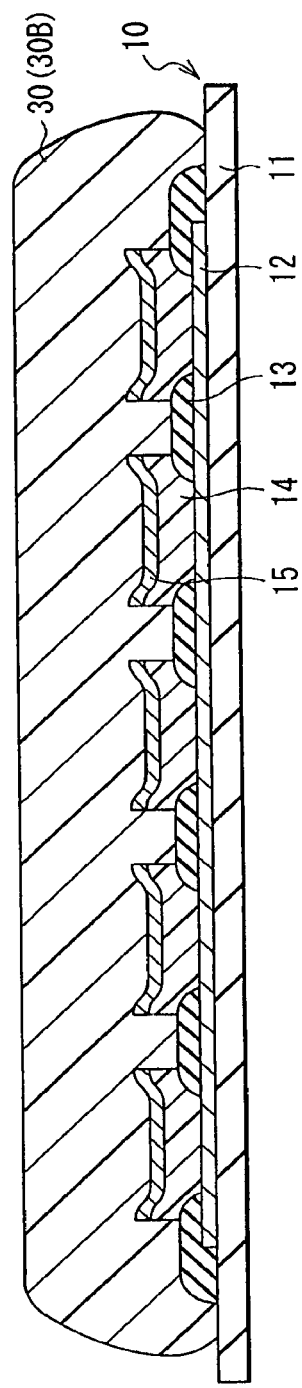

After forming the sealing panel 20 and the drive panel 10, as shown in FIG. 6C, for example, a thermosetting resin is coated on a surface of the substrate for drive 11 where the organic electroluminescence devices 10R, 10G and 10B are formed so as to form the portion 30B cured with heat in the adhesive layer 30. The step of coating may be carried out through, for example, discharging the resin from a slit nozzle type dispenser, roll coating or screen printing. For the portion 30B cured with heat in the adhesive layer 30, one coating liquid or a combination of two coating liquids is used for curing. Further, in the case of a combination of two or more coating liquids, the coating liquids may be coated at the same time or separately in any order. When coating the coating liquids at the same time, a mixture of the coating liquids may be coated, or the coating liquids may be coated at the same time so as to be mixed. When coating the coating liquids separately, after the coating liquids are coated in order, the liquids may be mixed by, for example, the application of pressure caused by bonding the sealing panel 20 and the drive panel 10 together.

Next, as shown in FIG. 7A, the drive panel 10 and the sealing panel 20 are bonded together with the adhesive layer 30 in between. At this time, it is preferable that a surface of the sealing panel 20 on the side where the color filter 22 and the reflected-light absorbing film 23 are formed is disposed so as to face the drive panel 10. Further, it is preferable not to enter air bubbles into the adhesive layer 30.

Then, as shown in FIG. 7B, for example, the sealing panel 20 is moved in a direction indicated with an arrow to align the relative position between the sealing panel 20 and the drive panel 10. In other words, the positions of the organic electroluminescence devices 10R, 10G and 10B and the color filter 22 are aligned. At this time, the adhesive layer 30 is not yet cured, so the relative position between the sealing panel 20 and the drive panel 10 can be moved approximately a few hundred Rm. The relative position between the sealing panel 20 and the drive panel 10 is aligned to temporarily fix the sealing panel 20. For example, an ultraviolet cure resin is coated on at least a part of the edge portion of the adhesive layer 30 so as to straddle between the sealing panel 20 and the drive panel 10, and the ultraviolet radiation UV is applied from the side of the sealing panel 20 to cure the ultraviolet cure resin, thereby the temporary fixing portion 30A is formed so as to be capable of temporarily fixing the sealing panel 20.

Figure 8:
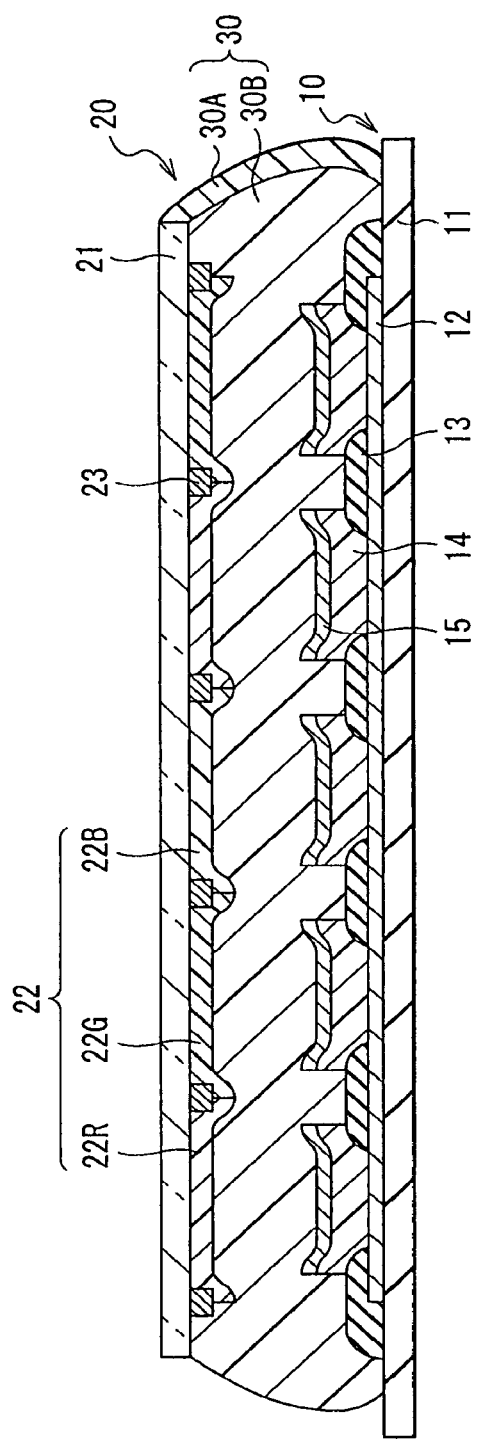
FIG. 8 is a cross sectional view showing a step following the step in FIG. 7B.

Finally, as shown in FIG. 8, the adhesive layer 30 is heated to an appropriate temperature to be cured, and thereby the drive panel 10 and the sealing panel 20 are bonded together. The curing temperature can be appropriately determined depending upon the heating time, such as 80° C. for a heating time of 2 hours and 60° C. for a heating time of 4 hours. Thus, the display apparatus shown in FIGS. 1 through 4 is completed.

In the display apparatus manufactured through the above steps, when a predetermined voltage is applied between the anode 12 and the cathode 15, a current is injected into the light-emitting layer 14C, and holes and electrons are bonded again to emit light mainly in an interface on the light-emitting layer 14C. The light is reflected several times between the anode 12 and the semi-transparent electrode 15A, and passes through the cathode 15, the adhesive layer 30, the color filter 22 and the substrate for sealing 21 to be extracted from the side of sealing panel 20. In the embodiment, as the color filter 22 and the reflected-light absorbing film 23 are disposed on the sealing panel 20, external light incident from the sealing panel 20 is prevented from being reflected on the organic electroluminescence devices 10R, 10G and 10B and then being emitted from the sealing panel 20, thereby the contrast can be improved.

Moreover, in the embodiment, in each of the organic electroluminescence devices 10R, 10G and 10B, the resonator including the semi-transparent electrode 15A and the anode 12 as a resonant portion is constituted, so by multiple interference, the half-value width of the spectrum of extracted light can be reduced, and color purity can be improved, as well as external light is attenuated, and the reflectance of the external light is reduced by a combination of the color filter 22. In other word, the contrast can be further improved.

Thus, according to the embodiment, the color filter 22 is disposed on the substrate for sealing 21, and the sealing panel 20 and the drive panel 10 are bonded together with the adhesive layer 30 disposed so as to cover the organic electroluminescence devices 10R, 10G and 10B, so external light incident from the sealing panel 20 can be prevented from being reflected on the organic electroluminescence devices 10R, 10G, 10B and so on, and then being emitted from the sealing panel 20. Therefore, the contrast can be improved. Moreover, the adhesive layer 30 can securely seal the organic electroluminescence devices 10R, 10G and 10B, so the organic electroluminescence devices 10R, 10G and 10B can be effectively prevented from corrosion and damage. Further, the adhesive layer 30 is cured with heat, so the drive panel 10 and the sealing panel 20 are easily bonded together with the adhesive layer 30 having excellent and stable adhesive properties, regardless of the presence or the absence of the color filter 22.

Still further, the temporary fixing portion 30A is formed in a part of the edge portion of the adhesive layer 30 to align the relative position of the sealing panel 20 with the drive panel 10, so more accurate alignment can be carried out. In addition, the temporary fixing portion 30A is made of an ultraviolet cure resin, so the temporary fixing portion 30A can be cured at a lower temperature for a shorter time. Thereby, temporary fixation can be carried out with ease and accuracy.

Moreover, when each of the organic electroluminescence devices 10R, 10G and 10B have the resonator including the semi-transparent electrode 15A and the anode 12 as a resonant portion, multiple interference of light generated in the light-emitting layer 14C arises to function as a kind of narrow-band filter, so the half-value width of the spectrum of extracted light can be reduced, and color purity can be improved. Further, external light incident from the sealing panel 20 can be attenuated by the multiple interference, so by a combination of the color filter 22, the reflectance of the external light on the organic electroluminescence devices 10R, 10G and 10B can become extremely small. Therefore, the contrast can be further improved.

[Second Embodiment]

Figure 9:
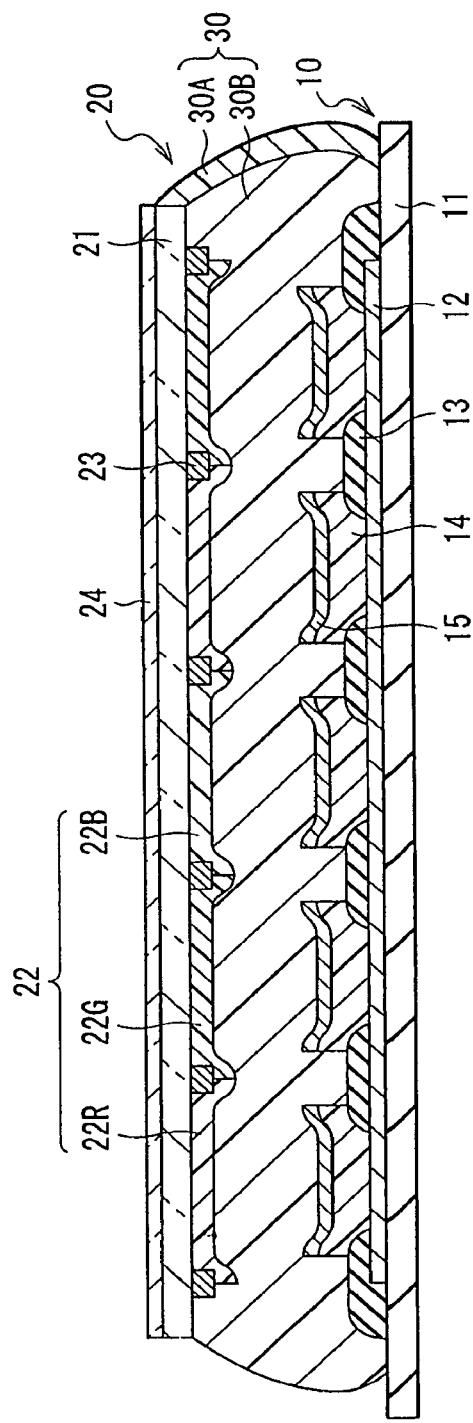
FIG. 9 is a cross sectional view of a display apparatus according to a second.

FIG. 9 shows a display apparatus according to a second embodiment. The display apparatus is equivalent to the display apparatus described in the first embodiment except that an antireflective film 24 is disposed on a surface of the substrate for sealing 21 on the opposite side of the drive panel 10. Therefore, like components are denoted by like numerals as of the first embodiment and will not be further explained.

The antireflective film 24 is provided to prevent surface reflection of external light on the substrate for sealing 21. When the substrate for sealing 21 is made of, for example, glass, the surface reflection thereof is approximately 4%, because when the reflection of the external light inside the display apparatus is inhibited by the color filter 22, the reflected-light absorbing film 23 and so on, the surface reflection on the substrate for sealing 21 is not negligible.

The antireflective film 24 is preferably made of a thin film filter including a laminate of, for example, silicon oxide ($SiO_2$), and titanium oxide ($TiO_2$) or niobium oxide ($Nb_2O_5$).

Thus, according to the embodiment, in addition to effects described in the first embodiment, as the antireflective film 24 is disposed on the substrate for sealing 21, the surface reflection of the external light on the substrate for sealing 21 can be reduced, thereby the contrast can be further improved. Incidentally, as of the above first embodiment, the adhesive layer 30 is cured with heat, and the second embodiment provides the effects equal to those of the above first embodiment.

In the above embodiments, although the case that the color filter 22 and the reflected light absorbing film 23 are disposed on the substrate for sealing 21 is described, the reflected-light absorbing film 23 may or may not be disposed as required.

Moreover, in the above embodiments, the adhesive layer 30 is disposed on the whole surface of the drive panel 10, but the adhesive layer 30 may be disposed to cover at least the organic electroluminescence devices 10R, 10G and 10B. Further, in the above embodiments, the temporary fixing portion 30A is disposed in a part of the edge portion of the adhesive layer 30, but the temporary fixing portion 30A may be disposed on, for example, the whole edge portion of the adhesive layer 30 so as to surround the adhesive layer 30.

In addition, in the above embodiments, the structures of the organic electroluminescence devices 10R, 10G and 10B are described referring to specific components. However, the organic electroluminescence devices 10R, 10G and 10B may not include all layers such as the insulating layer 13—or the transparent electrode 15B, or may further include any other layers. The embodiments are applicable to the case where the semitransparent electrode 15A is not included, although as described in the above embodiments, the resonator with the semi-transparent electrode 15A and the anode 12 as a resonance portion is preferably included, because the reflectance of the external light on the organic electroluminescence devices 10R, 10G and 10B can be further reduced, and thereby the contrast can be further improved.

Still further, in the above embodiments, the first electrode is the anode, and the second electrode is the cathode, but the first electrode may be the cathode and the second electrode may be the anode. In this case, light is extracted from the side of the anode, and the anode is made of a semi-transparent electrode, a transparent electrode or the like.

Moreover, in the above embodiments, the material of the organic layer 14 is changed so as to emit red, green or blue light, however, the embodiments are applicable to a display apparatus which emits these light by a combination of color changing mediums (CCM) or a combination of color filters.

As described above, according to the display apparatus of the embodiments, the drive substrate including the organic electroluminescence devices and the substrate for sealing including the color filter are bonded together with at least the adhesive layer which is cured with heat, so by the adhesive layer having excellent and stable adhesive properties, the drive panel and the sealing panel can be easily bonded together, and thereby, the display apparatus of the type that light is extracted from the side of the second electrode can be easily implemented.

More specifically, according to the display apparatus of an embodiment, the temporary fixing portion is formed in at least a part of the edge portion of the adhesive layer so as to straddle between the sealing panel and the drive panel, and aligns the relative position of the sealing panel with the drive panel, so more accurate alignment can be carried out. Moreover, according to the display apparatus of another aspect of the embodiment, the temporary fixing portion is made of an ultraviolet cure resin, so the temporary fixing portion can be cured at a lower temperature for a shorter time, thereby temporary fixation can be carried out with ease and accuracy.

In addition, according to the display apparatus of still another aspect of the embodiment, the antireflective film is disposed on the substrate for sealing, so the surface reflection of the external light on the substrate for sealing can be reduced, and thereby the contrast can be further improved.

Further, according to the display apparatus of a further aspect of the embodiment, the semi-transparent electrode and the first electrode constitute a resonant portion of the resonator, so the multiple interference of light generated in the light-emitting layer arises to function as a kind of narrow-band filter. Thereby, the half-value width of the spectrum of extracted light can be reduced, and color purity can be improved. In addition, the external light incident from the sealing panel can be attenuated by the multiple interference, and by a combination of the color filter, the reflectance of the external light on the organic electroluminescence devices can become extremely small. Therefore, the contrast can be further improved.

Obviously many modifications and variations of the present embodiment are possible in the light of the above teachings. It is therefore to be understood that within the scope of the appended claims the invention may be practiced otherwise than as specifically described.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display apparatus comprising:
a first substrate with a plurality of organic electroluminescence devices;
a second substrate with a color filter, the second substrate facing the first substrate;

an adhesive layer disposed in a first area between edge portions of the first substrate and the second substrate, wherein the adhesive layer is not disposed in at least a second area between the edge portions.

2. The display apparatus according to claim 1, wherein the adhesive layer is made of at least one coating liquid for curing.

3. The display apparatus according to claim 1, wherein the color filter is disposed on a side of the second substrate facing the first substrate.

4. The display apparatus according to claim 1, wherein a reflected-light absorbing film is disposed on the second substrate.

5. The display apparatus according to claim 1, further comprising a temporary fixing portion made of an ultraviolet cure resin in a part of an edge portion of the adhesive layer.

6. The display apparatus according to claim 1, wherein each of the plurality of organic electroluminescence devices includes a first electrode, one or more organic layers including a light-emitting layer, and a second electrode laminated in this order from the first substrate side.

7. The display apparatus according to claim 6, wherein the second electrode includes a semitransparent electrode having semi-transparency for light generated in the light-emitting layer, and a transparent electrode having transmittance for the light generated in the light-emitting layer, which are laminated in this order from the side of the organic layer.

8. The display apparatus according to claim 1, further comprising an antireflective film on the second substrate.

9. The display apparatus according to claim 1, wherein the adhesive layer is configured to block at least a portion of ambient ultraviolet light from the plurality of organic electroluminescent devices.

10. The display apparatus according to claim 9, wherein the adhesive layer includes an ultraviolet cure resin.

11. The display apparatus according to claim 1, wherein a portion of the adhesive layer is formed on a sidewall of the second substrate.

12. The display apparatus according to claim 1, wherein the adhesive layer is crescent-shaped and is convex towards an outer side of the adhesive layer.

* * * * *